United States Patent [19]
Fujioka et al.

[11] Patent Number: 4,772,811
[45] Date of Patent: Sep. 20, 1988

[54] PROGRAMMABLE LOGIC DEVICE

[75] Inventors: Takuro Fujioka, Minoo; Akira Takata, Amagasaki, both of Japan

[73] Assignee: Ricoh Company, Ltd., Tokyo, Japan

[21] Appl. No.: 70,786

[22] Filed: Jul. 6, 1987

[30] Foreign Application Priority Data

Jul. 4, 1986 [JP] Japan .............................. 61-158293
Jul. 15, 1986 [JP] Japan .............................. 61-167420
Jul. 22, 1986 [JP] Japan .............................. 61-173419

[51] Int. Cl.$^4$ .............. G06F 11/20; G06F 11/22; G11C 29/00
[52] U.S. Cl. .............................. 307/465; 364/716; 365/231
[58] Field of Search .............. 307/465, 466, 467, 468, 307/469; 365/96, 103, 104, 231; 364/716, 737

[56] References Cited

U.S. PATENT DOCUMENTS

| | | | |
|---|---|---|---|
| 4,506,341 | 3/1985 | Kalter et al. | 307/465 X |
| 4,511,812 | 4/1985 | Satake | 307/465 |
| 4,617,649 | 10/1986 | Kyomasu et al. | 307/465 X |
| 4,689,654 | 8/1987 | Brockmann | 307/465 X |
| 4,721,868 | 1/1988 | Cornell et al. | 307/465 |
| 4,727,268 | 2/1988 | Hori | 307/468 X |

Primary Examiner—Stanley D. Miller
Assistant Examiner—David R. Bertelson
Attorney, Agent, or Firm—Cooper & Dunham

[57] ABSTRACT

A programmable logic device of a single semiconductor chip includes a plurality of programmable AND-OR logic blocks, each block including an AND gate array and an OR gate array and at least a pair of input and output lines; a plurality of input/output buffer blocks, each block including at least one input and output lines; and a plurality of interconnection lines across which the input and output lines extend. A programmable switch is provided at each of the intersections between the input and output lines and the interconnection lines, so that each of the input and output lines are selectively connected to a desired one of the interconnection lines. Preferably, each of the interconnection lines further includes at least one programmable switch so that each of the interconnection lines may be divided into a desired number of segments which are electrically isolated from one another. A programmable logic device may include a plurality of programmable logic unit cells and first interconnecting means for interconnecting the cells, each of the cells including a plurality of programmable AND-OR logic blocks, a plurality of input/output blocks and second interconnecting means for interconnecting the blocks.

26 Claims, 10 Drawing Sheets

PROGRAMMABLE LOGIC DEVICE

BACKGROUND OF THE INVENTION

1. Field of the Invention

This invention generally relates to a programmable semiconductor logic device which can be programmed to define a desired logic function, and, in particular, to a field programmable logic device including an AND gate array and an OR gate array, at least one of which may be programmed by a user to define a desired logic function.

2. Description of the Prior Art

A field programmable semiconductor logic device is well known in the art. And, such a programmable logic device typically includes an AND gate array (or sometimes called an AND plane) and an OR gate array (or sometimes called an OR plane). In one type of the programmable logic device, only the AND gate array is programmable and the OR gate array is fixed and thus non-programmable. In another type, both of the AND and OR gate arrays are programmable. It is to be noted that the term programmable logic array or PLD for short is used herein to embrace any type of semiconductor programmable logic devices including both AND and OR gate arrays, at least one of which is programmable by the user.

In a typical prior art field programmable logic device, input lines from an input buffer extend across product term lines of an AND-OR block, including an AND gate array and an OR gate array, and a programmable element is provided at each intersection between the product term lines and the input lines. However, a programmable logic device requiring an increased number of input/output pins has an increased number of input lines and also an increased number of product term lines. However, there is a limit for the number of input/output pins because of the availability of chip area and also the number of gates to be provided in one chip. In addition, as the number of product term lines increases, the operational speed becomes reduced. There is also a further problem of increased waste of elements because an increased proportion of the AND-OR block may be left unused depending on a desired logic function.

SUMMARY OF THE INVENTION

In accordance with the first aspect of the the present invention, there is provided a programmable logic device including a plurality of AND-OR blocks, each of which includes an AND gate array and an OR gate array, at least one of said gate arrays being programmable, a plurality of input/output buffer blocks, and a plurality of interconnection lines for selectively establishing an interconnection between at least one of said plurality of AND-OR blocks and at least one of said plurality of input/output buffer blocks. In the preferred embodiment, a pair of input and output lines extending from each of said plurality of AND-OR blocks extends across said plurality of interconnection lines and a pair of input and output lines extending from each of said plurality of input/output buffer blocks also extends across said plurality of interconnections lines. And, at each of the intersections between said input and output lines and said plurality of intersection lines is provided a programmable switch element which can take either one of two conditions, including a connection condition for establishing a connection between the input or output line and the interconnection line and a disconnection condition for establishing a disconnection condition therebetween.

In the preferred embodiment, at least one decoder is provided for controlling the programming condition of each of the programmable switch elements provided at the intersections between the input and output lines and the interconnection lines. In addition, each of the interconnection lines is preferably divided into a plurality of segments, thereby defining a group of segmented interconnection lines, and a programmable switch element is provided between the two adjacent segments of each of the interconnection lines. In the preferred embodiment, the interconnection lines extend in a closed loop to surround the plurality of AND-OR blocks and the plurality of input/output buffer blocks are arranged outside of the closed loop.

In accordance with another aspect of the present invention, there is provided a programmable logic device comprising a plurality of logic unit cells, each of which includes at least one AND-OR block, at least one input/output buffer block and first programmable interconnection means for establishing a first desired interconnection pattern between said AND-OR and input/output buffer blocks selectively, and second programmable interconnection means for establishing a second desired interconnection pattern among said plurality of logic unit cells. In the preferred embodiment, the AND-OR block includes an AND gate array and an OR gate array, at least one of which is programmable by the user. Specifically, in one embodiment, the AND gate array is programmable and the OR gate array is fixed and not programmable. In another embodiment, both of the AND and OR gate arrays are programmable by the user. In the preferred embodiment, the logic unit cell includes a plurality of AND-OR blocks, a plurality of input/output buffer blocks and first programmable interconnection means for establishing a desired interconnection pattern between said plurality of AND-OR blocks and said plurality of input/output buffer blocks.

Preferably, each of the first and second programmable interconnection means includes programmable switch means which can be programmed to have either one of two conditions: connection and disconnection conditions, whereby the condition of the programmable switch means is selected by the user to define each of said first and second connection patterns.

In accordance with a further aspect of the present invention, an AND-OR structure and an input/output buffer structure are provided separately in the form of a block or unit. And, in the preferred embodiment, the AND-OR block is provided in plurality by making each block relatively smaller in size instead of providing a one large block. And, programmable interconnection means is provided between the plurality of AND-OR blocks and the input/output buffer blocks, thereby allowing to provide any interconnection pattern desired by the user. In the preferred embodiment, these AND-OR blocks, input/output buffer blocks and programmable interconnection means are defined in the form of a logic unit cell and a plurality of such logic unit cells are provided in the form of an array with the additional provision of additional programmable interconnection means for establishing a desired interconnection pattern among the plurality of logic unit cells, thereby providing a multi-layer structure.

It is therefore a primary object of the present invention to obviate the disadvantages of the prior art as described above and to provide an improved field programmable logic device.

Another object of the present invention is to provide an improved programmable logic device including an AND gate array and an OR gate array, at least one of which is programmable by the user.

A further object of the present invention is to provide an improved programmable logic device which is so structured to minimize the unused rate of the AND-OR block.

A still further object of the present invention is to provide an improved programmable logic device capable of providing a desired number of input/output pins regardless of the number of product term lines of AND-OR blocks provided therein.

A still further object of the present invention is to provide an improved programmable logic device capable of defining a variety of logic functions without reductions in operational speed.

A still further object of the present invention is to provide an improved programmable logic device which can be made larger in scale without requiring an attendant proportionate increase in chip area.

Other objects, advantages and novel features of the present invention will become apparent from the following detailed description of the invention when considered in conjunction with the accompanying drawings.

BRIEF DESCRIPTION DRAWINGS

Figure 6:
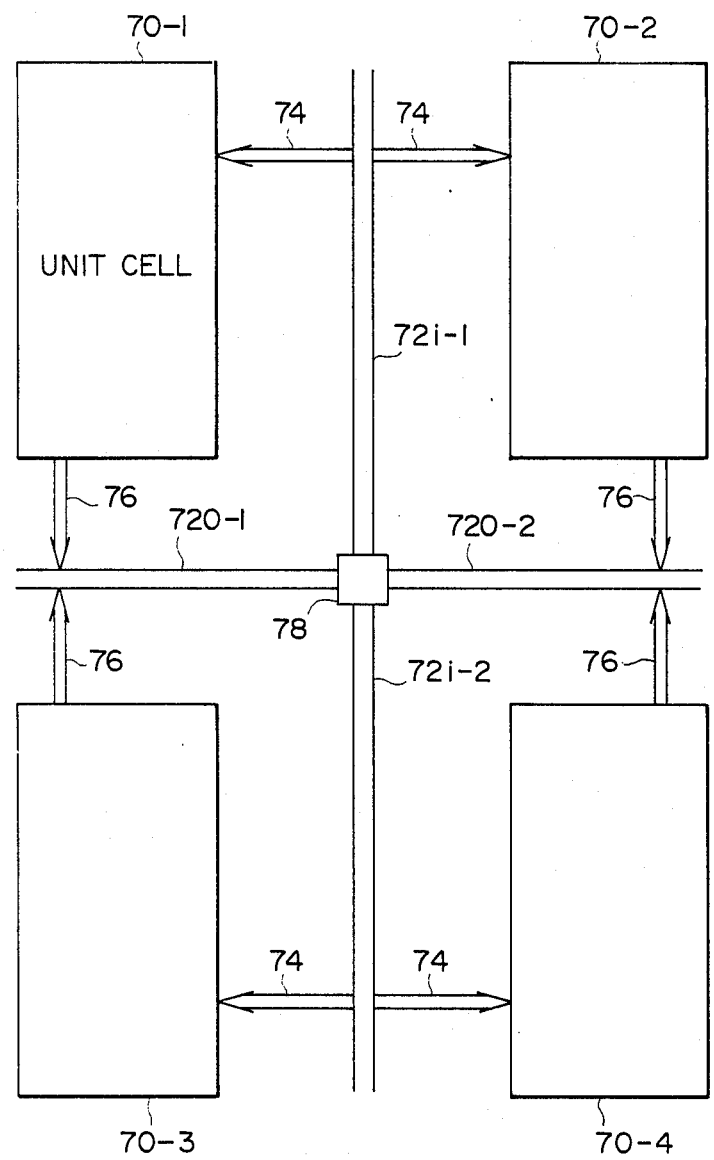
FIG. 6 is a block diagram schematically showing a programmable logic device, which includes a plurality of programmable logic unit cells and programmable interconnection means for establishing a desired interconnection pattern among the plurality of programmable logic unit cells, constructed in accordance with another embodiment of the present invention.
Figure 10:
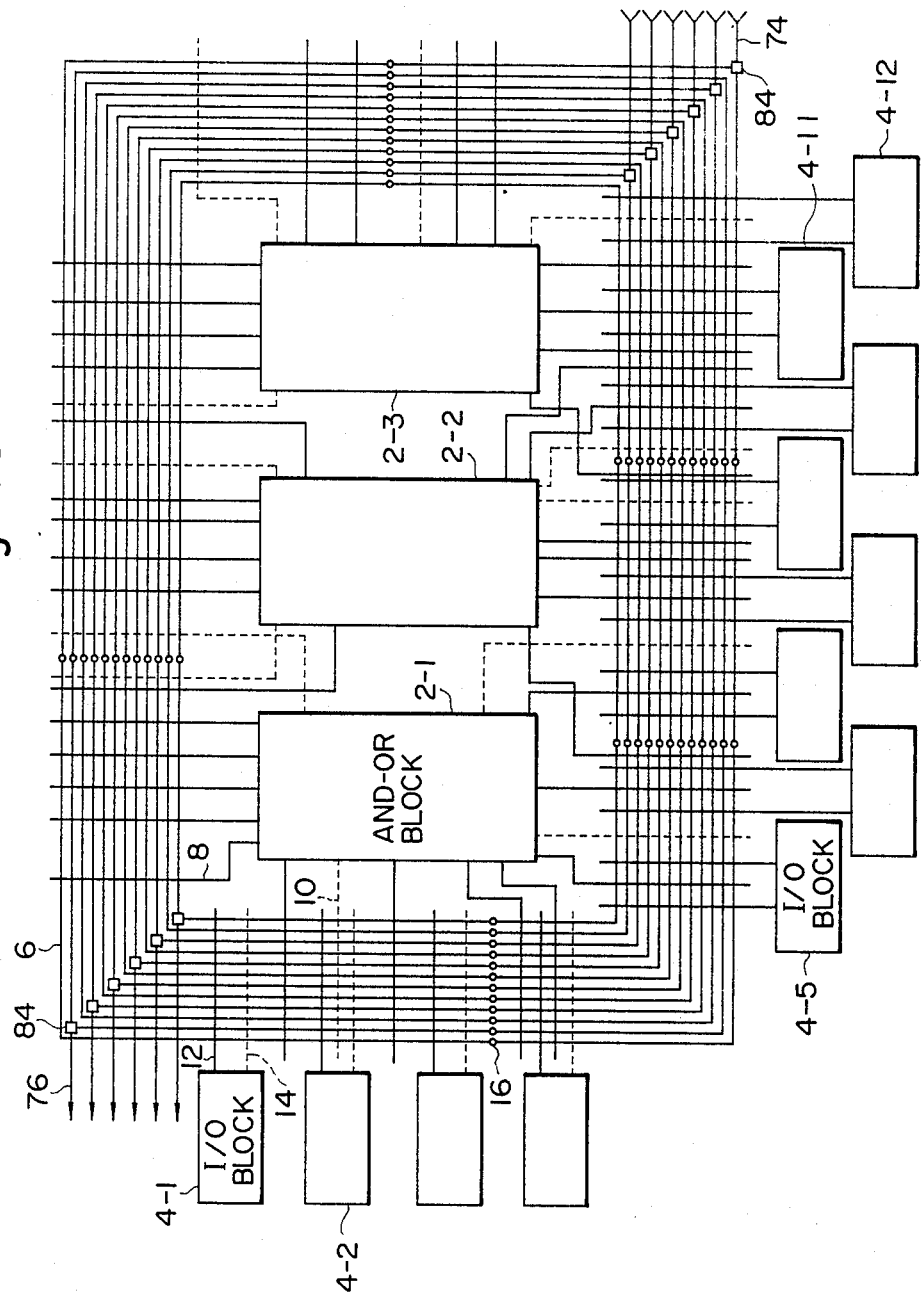
Figure 11:
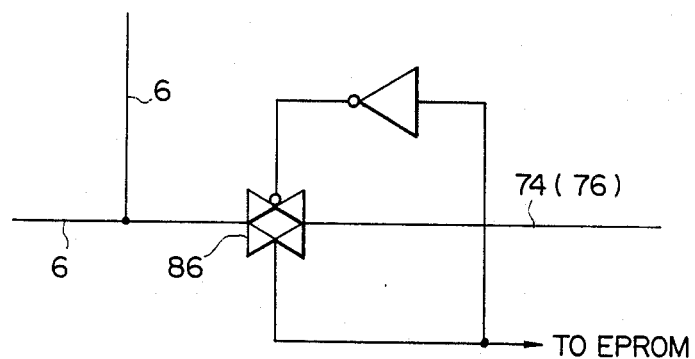

FIG. 10 is a block diagram showing the detailed structure of a programmable logic unit cell which can be advantageously applied to the structure shown in FIG. 6; and FIG. 11 is a schematic illustration showing an example of a programmable switch which can be advantageously used for programmably establishing an electrical connection between the programmable logic unit cell and its input and output lines in the structure shown in FIG. 6.

DESCRIPTION OF THE PREFERRED EMBODIMENTS

Figure 1:
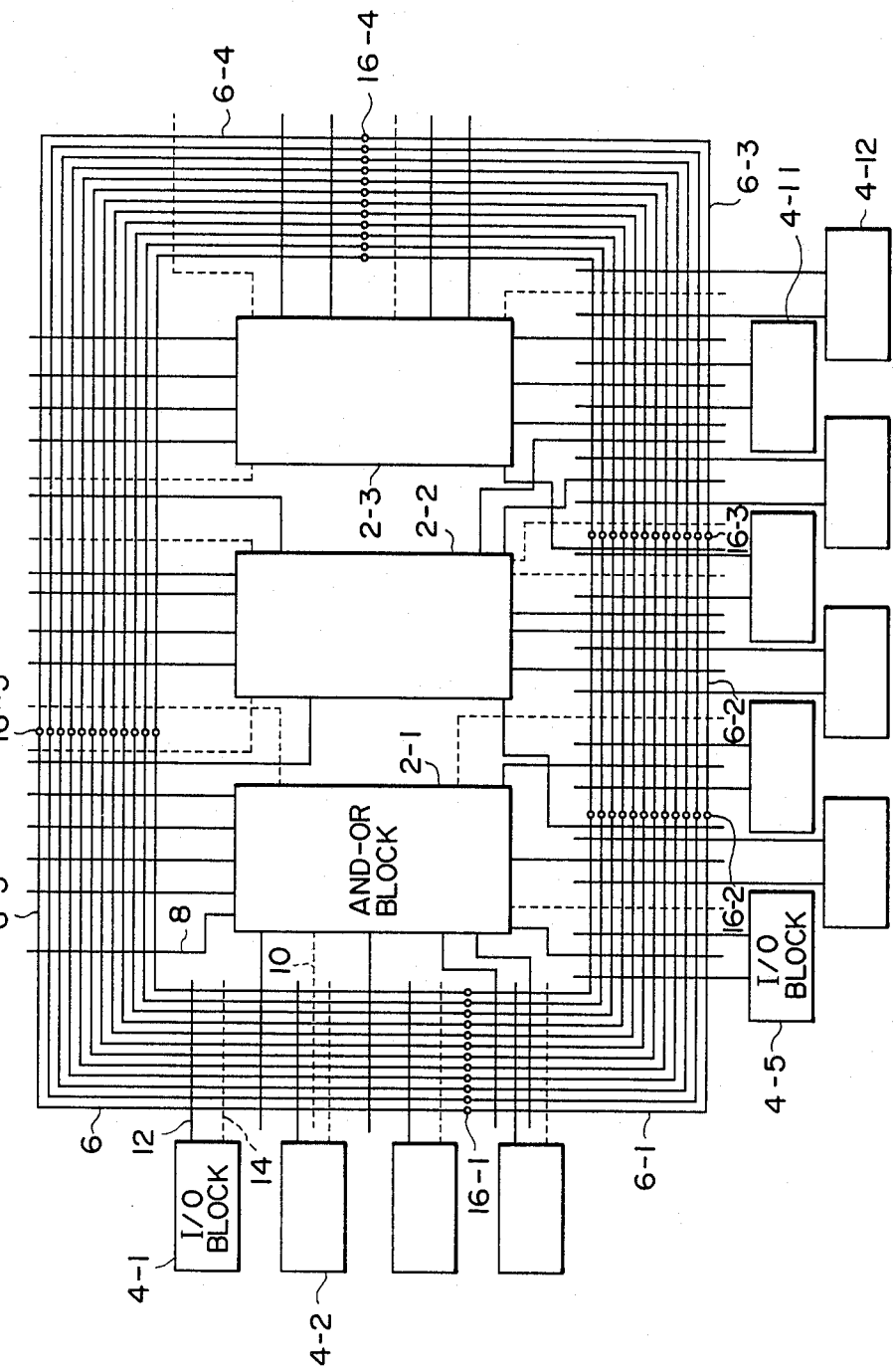
FIG. 1 is a block diagram schematically showing a programmable logic device, which includes a plurality of AND-OR blocks, a plurality of inout/output buffer blocks and programmable interconnection means for establishing a desired interconnection pattern between the AND-OR and input/output buffer blocks, constructed in accordance with one embodiment of the present invention.

Referring now to FIG. 1, there is schematically shown a programmable logic device constructed in accordance with one embodiment of the present invention. As shown, the illustrated programmable logic device includes a plurality of programmable AND-OR logic blocks 2-1 through 2-3 arranged side-by-side in the form of a single array. Each of the AND-OR logic blocks 2-1 through 2-3 includes at least an AND gate array and an OR gate array, at least one of which is programmable by the user. Specifically, in one type, the AND gate array is programmable and the OR gate array is fixed and thus not programmable. In another type, both of the AND and OR gate arrays are programmable. It is to be noted that the AND-OR logic block thus includes at least one programmable element, such as a fuse, a bipolar transistor, or a reprogrammable element, such as a FAMOS or stacked-gate MOS transistor, or any other element. Thus, a desired logic function can be defined in the AND-OR logic block by programming.

In the illustrated embodiment, a plurality of interconnection lines 6 are provided in the form of a closed loop to completely surround the array of AND-OR blocks 2-1 through 2-3. Such interconnection lines 6 are preferably comprised of metal lines which are formed on top of a semiconductor device including the AND-OR blocks 2-1 through 2-3. In the illustrated embodiment, twelve metal lines are provided in parallel to define the interconnection lines 6, though the present invention should not be limited only to such a specific number. In addition, a plurality of input/output buffer blocks 4-1 through 4-12 are also provided as located outside the boundary of the closed loop defined by the plurality of interconnection lines 6. Each of the input/output buffer blocks 4-1 through 4-12 includes at least one input/output buffer.

As shown in FIG. 1, an input line 8 extends from each of the AND-OR blocks 2-1 through 2-3, crossing over the interconnection lines 6 as indicated by the solid line. It is to be noted that a programmable (preferably, reprogrammable) switch is provided at each or at least some of the intersections between the input line 8 and the interconnection lines 6. Furthermore, an output line 10 extends from each of the AND-OR blocks 2-1 through 2-3 and crosses over the interconnection lines 6 as indicated by the dotted line. It is to be noted that a programmable (preferably, reprogrammable) switch is provided at each of at least some of the intersections between the output line 10 and the interconnection lines 6. In addition, each of the input/output buffer blocks 4-1 through 4-12 has an input line 12 which extends across the interconnection lines 6 as indicated by the solid line and an output line 14 which also extends across the interconnection lines 6 as indicated by the dotted line. And, a programmable (preferably, reprogrammable) switch is also provided at each of or at least some of the intersections between the input and output lines 12 and 14 of each of the input/output buffer blocks 4-1 through 4-12 and the interconnection lines 6.

In the illustrated embodiment, each of the loop-shaped interconnection lines 6 is divided into a plurality (five in the illustrated embodiment) of interconnection line segments 6-1 through 6-5. And, a programmable (preferably, reprogrammable) switch 16 is also provided at each of the dividing points of each of the loop-shaped interconnection lines 6 into segments 6-1 through 6-5. Thus, when all of the switches 16-1 through 16-5 of the same loop-shaped interconnection line 6 are turned on, all of the segments 6-1 through 6-5 of the interconnection line 6 are connected to define a single interconnection line. On the other hand, if all of the switches 16-1 through 16-5 are turned off, then the five interconnection line segments 6-1 through 6-5 of the same interconnection line 6 are not connected one from other, thereby providing five separate interconnection line segments 6-1 through 6-5.

It is to be noted that all of the elements shown in FIG. 1 are preferably fabricated on the same single semiconductor chip or substrate, though such a chip or substrate is not shown specifically.

With the above-described structure, an externally applied signal entering through an input/output pin (not shown) is supplied to the input/output buffer blocks 4-1 through 4-12 from where the externally applied signal is supplied to the output lines 14. Since the programmable switches provided at the intersections between the output lines 14 and the interconnections lines 6 are selectively turned on and tuned off so that the output lines 14 are selectively connected to the interconnection lines 6. Similarly, the programmable switches 16 provided in the interconnection lines 6 are also selectively turned on. In addition, the programmable switches provided at the intersections between the input lines 8 and the interconnection lines 6 are also selectively turned on. As a result, a desired interconnection pattern is defined between the output lines 14 of the input/output buffer blocks 4-1 through 4-12 and the input lines 8 of the AND-OR blocks 2-1 through 2-3. Thus, the externally applied signal may be transmitted to one or more of the input lines 8 of the AND-OR blocks 2-1 through 2-3 selectively.

On the other hand, the programmable switches provided at the intersections between the output lines 10 of the AND-OR blocks 2-1 through 2-3 and the interconnection lines 6 are also selectively turned on and the programmable switches provided at the intersections between the input lines 12 of the input/output buffer blocks 4-1 through 4-12 and the interconnection lines 6 are also selectively turned on. And, thus, another desired interconnection pattern is defied between the output lines 10 of the AND-OR blocks 2-1 through 2-3 and the input lines 12 of the input/output buffer blocks 4-1 through 4-12. As a result, a signal output from each of the AND-OR blocks 2-1 through 2-3 can be supplied to the input/output pin through the second interconnection pattern thus defined.

Figure 2:
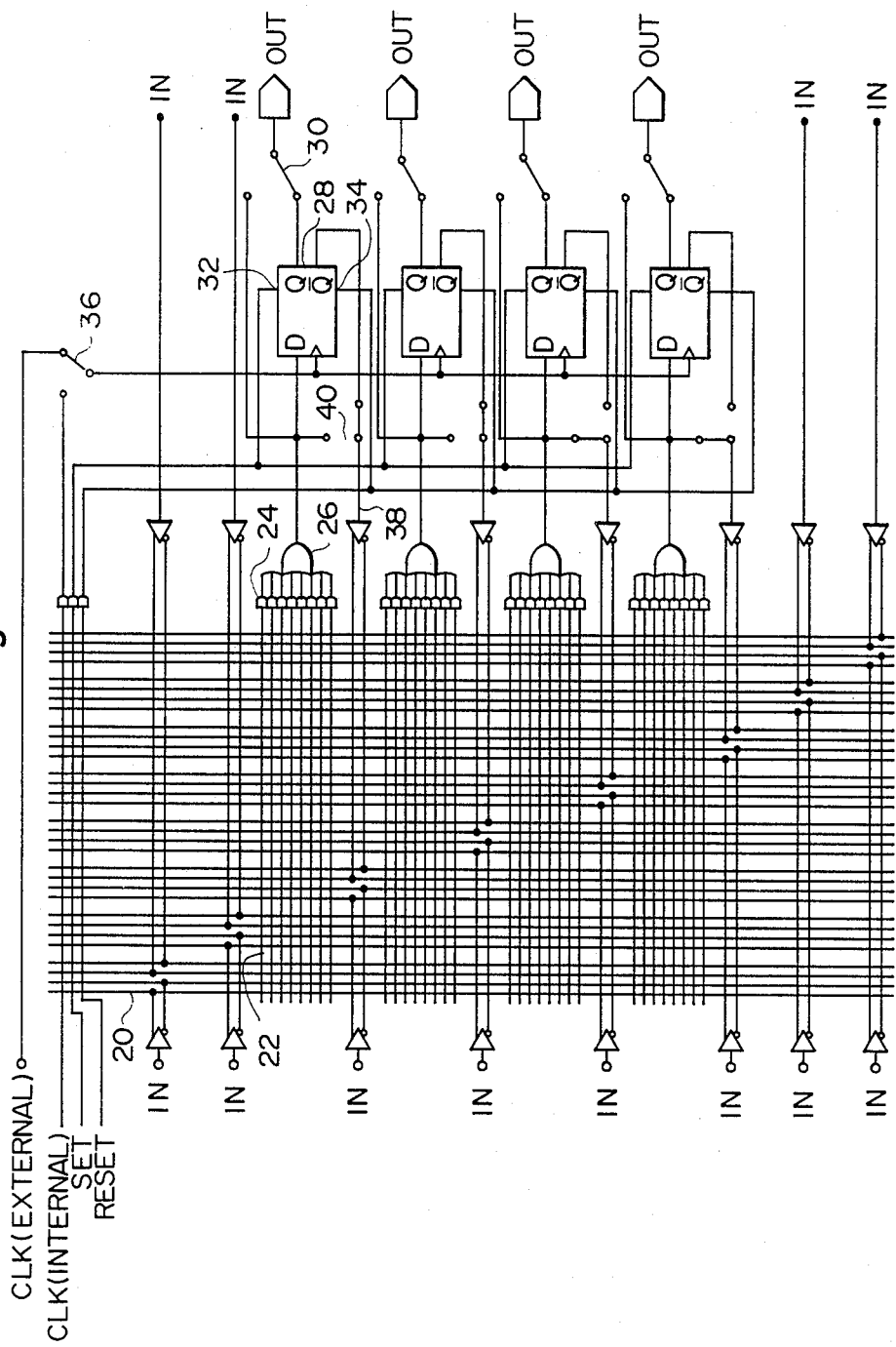
FIG. 2 is a schematic illustration showing the detailed structure of one example of AND-OR block which can be advantageously used in the structure shown in FIG. 1.

Referring now to FIG. 2, there is schematically shown in detail the internal structure of one example of the AND-OR block 2 which can be advantageously applied to the device shown in FIG. 1. The structure shown in FIG. 2 fundamentally includes a user-programmable AND gate array and a fixed and thus user-nonprogrammable OR gate array, which is similar to the so-called PAL structure. In the preferred embodiment, the AND gate array includes a plurality of EPROMs which may be programmed selectively by the user. It is to be noted that the AND gate array may also include other programmable or reprogrammable elements, such as fuses, bipolar transistors, and FAMOS and SAMOS transistors.

As shown in FIG. 2, a plurality of input lines 20 are provided. In the illustrated embodiment, the plurality of input lines 20 are provided to run in the vertical direction and are paired and each pair of input lines 20 is connected to an input terminal through an input buffer so that one of the paired input lines 20 carries an input signal as applied to the input terminal and the other of the paired input lines 20 carries an inverted version of an input signal applied to the input terminal. That is, a plurality of input terminals are arranged in a vertical column at the left of the AND gate array and each of the input terminals is connected to a corresponding input buffer from which a pair of input leads extend horizontally to be electrically connected to the corresponding pair of vertically running input lines 20, respectively. In addition, in the illustrated embodiment, a plurality of product term lines 22 are also provided as running horizontally and thus crossing the vertically running input lines 20. Each of the product term lines 22 is connected to an AND sense circuit 24 at the right end thereof.

In the illustrated embodiment, a programmable or preferably reprogrammable, such as an EPROM, switch element is provided at each of the intersections between the input lines 20 and the procduct term lines 22. Thus, there is defined a programmable AND gate array. The output terminal of each of a group of predetermined number of AND sense circuits 24 is connected to the corresponding input terminal of an OR circuit 26. Thus, the product term lines 22 are divided into a predetermined number (four in the illustrated example) of groups, each of which is associated with a corresponding one of the four OR circuits 26. Thus, in the illustrated embodiment, the OR gate array is defined by the vertical single array of four OR gates 26 which are fixed in structure and thus not programmable by the user.

The output terminal of each of the OR circuits 26 is connected to a D input terminal of a D type flip-flop circuit 28 and also to an upper contact point of a selection switch 30 whose lower contact point is connected to the Q output terminal of the flip-flop circuit 28. Thus, by selectively setting the switch 30 to establish connection with either one of the upper and lower contact points, an output signal from the OR circuit 26 may be outputted through the flip-flop circuit 28 or by-passing the flip-flop circuit 28. The flip-flop circuit 28 also includes a set terminal 32 and a reset terminal 34 which may be programmed at the same time when the AND gate array is programmed. The flip-flop circuit 28 receives either an external clock or an internal clock selectively through a switch 36. Also provided in this AND-OR block is a plurality of feed-back lines 38 each of which may be connected to the output terminal of the corresponding OR circuit 26 through another selection switch 40 when the selection switch 40 takes a first position or to the $\overline{Q}$ output terminal of the flip-flop circuit 28 through the selection switch 40 when the selection switch 40 takes a second position. Thus, depending on whether the selection switch 40 takes the first or second position, the output signal from the OR circuit 26 may be supplied either directly to the feedback line 38 as it is or indirectly through the flip-flop circuit 28. It should be noted that the input terminals IN of this AND-OR block are connected to the input lines 8 shown in FIG. 1 and the output terminals OUT of this AND-OR block are connected to the output lines 10 shown in FIG. 1.

Figure 3:
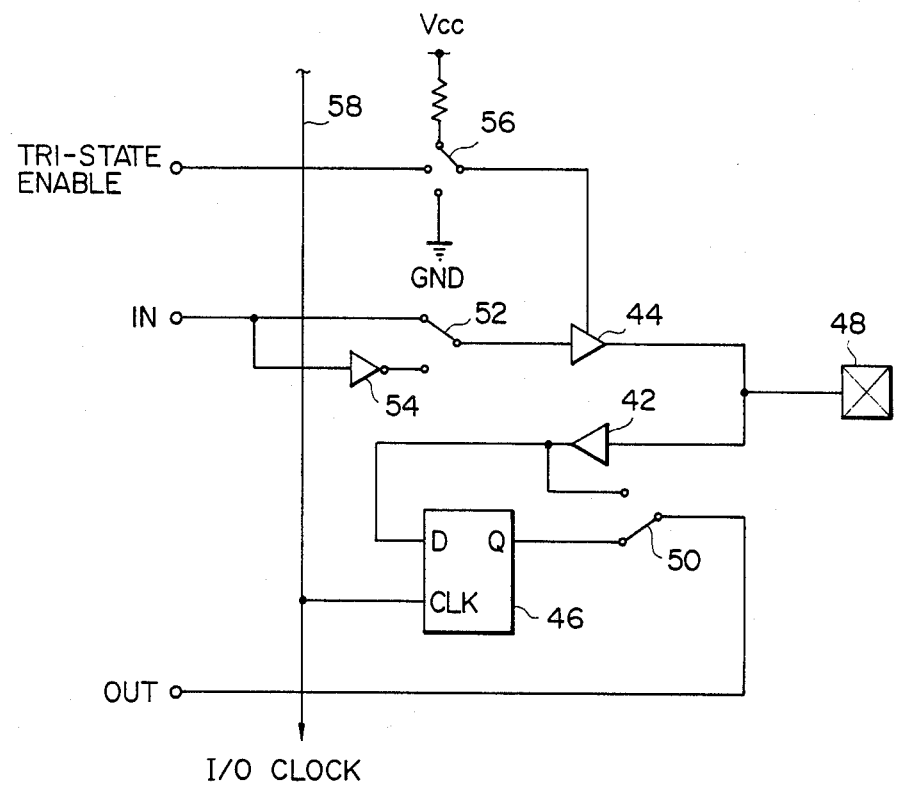
FIG. 3 is a schematic illustration showing the detailed structure of one example of an input/output buffer block which can be advantageously used in the structure shown in FIG. 1.

FIG. 3 shows the detailed structure of the input/output buffer block 4 provided in the structure shown in FIG. 1. As shown, the fundamental structure of the input/output buffer block 4 includes an input buffer 42, an output buffer 44, and a D type flip-flop 46 which synchronizes an externally applied input signal. As shown in FIG. 3, the input buffer 42 has its input terminal connected to an input/output pin 48 and its output terminal connected to a D input terminal of a flip-flop circuit 46 and also to an upper contact point of a switch 50 whose lower contact point is connected to a Q output terminal of the flip-flop circuit 46. The switch 50 has a common contact point which is connected to the output line 14 through an output terminal OUT of the buffer block 4. The buffer block 4 also includes an input terminal IN which is connected to the input line 12 and which is also connected to an upper contact point of a switch 52 and also to a lower contact point of the switch 52 via an inverter 54. The switch 52 also has a common contact point which is connected to an input terminal of an output buffer 44 which has its output terminal connected to the input/output pin 48. The output buffer 44 also has a control terminal which is connected to a common contact point of a switch 56 which has a first contact point connected to a supply voltage (Vcc), a second contact point connected to receive a tristate enable signal and a third contact point connected to ground.

In this input/output buffer block, when the input/output pin 48 is used as an input pin, a signal input through the input/output pin 48 passes through the input buffer 42 and it may be supplied to the output terminal OUT independently or in synchronism with another input signal, such as an I/O clock, by means of the switch 50. That is, when the switch 50 is set to establish a connection between the lower contact point and the common contact point as indicated in FIG. 3, the input signal from the input/output pin 48 will be first supplied to the flip-flop circuit 46 after passing through the input buffer 42. Then, the input signal thus input into the flip-flop circuit 46 is then supplied to the output terminal OUT in synchronism with the clock signal supplied to the flip-flop circuit 46 via clock line 58 which is commonly connected to all of the input/output buffer blocks 4-1 through 4-12.

On the other hand, when the input/output pin 48 is used as an output pin, a signal received at the input line 12 of the input/output buffer block 4 is supplied to the input terminal IN of the block 4. Then, the polarity of the input signal is determined by the state of the switch 52, i.e., whether or not the switch 52 has its common contact point connected to its upper contact point or to its lower contact point. If the switch 52 has its common contact point connected to its upper contact point, then the input signal maintains its polarity; whereas, if the switch 52 has its common contact point connected to its lower contact point, then the input signal changes its polarity because it passes through the inverter 54. In addition, the input signal, inverted or not inverted, is supplied to the output buffer 44 whereby the passing condition of this input signal through the output buffer 44 is controlled by the condition of the switch 56, as well known in the art.

Figure 4:
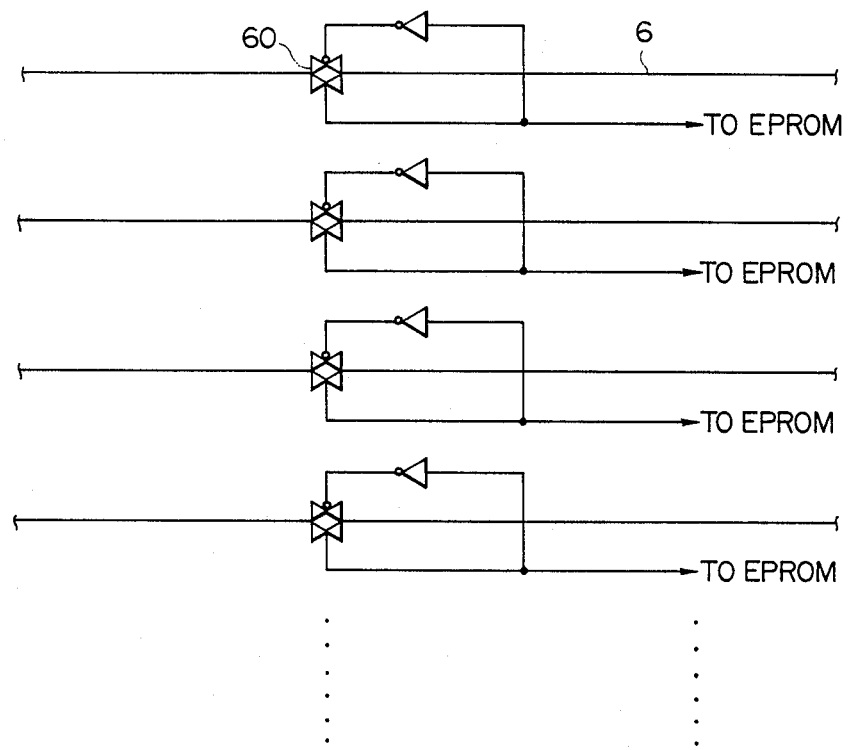
FIG. 4 is a schematic illustration showing the detailed structure of one example of programmable switches which can be advantageously provided in the interconnection lines of the structure shown in FIG. 1.

Now, with reference to FIG. 4, the structure of one example of the programmable switch 16 provided in each of the interconnection lines 6 will be described in detail. As shown in FIG. 4, a transmission gate 60 as the programmable switch 16 is provided in each of the interconnection lines 6. The transmission gate 60 itself is well known in the art and its detailed structure will not be described here. It suffices to say that the transmission gate 60 can take either an on state or an off state, and when the transmission gate 60 is set in its on state, the two adjacent interconnection line segments, e.g., 6-1 and 6-2, will be electrically connected through the transmission gate 60; on the other hand, when the transmission gate 60 is set in its off state, the two adjacent interconnection line segments are electrically disconnected from each other. The transmission gate 60 has a control terminal which is connected to an associated programmable element, such as an EPROM as in the illustrated embodiment. Thus, the transmission gate 60 may be set on or off by programming or deprogramming the associated EPROM.

Figure 5:
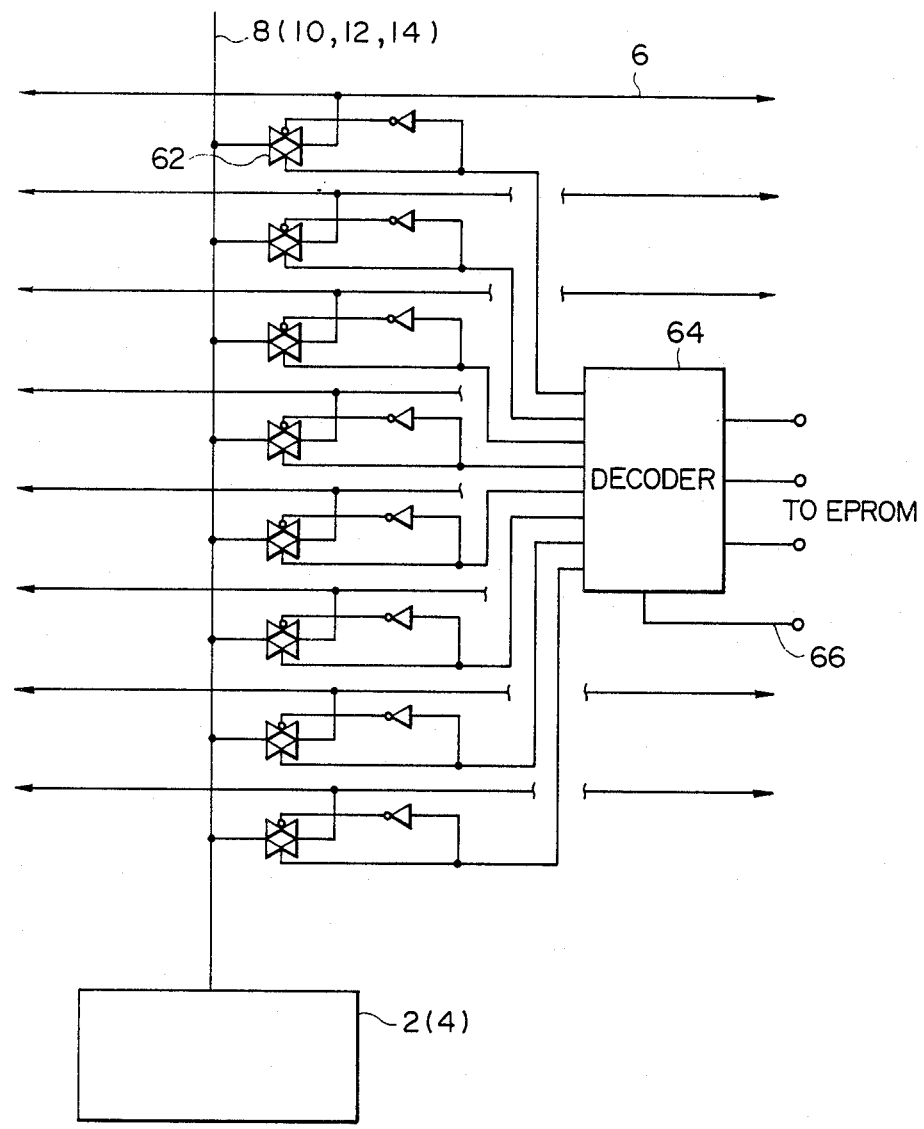
FIG. 5 is a schematic illustration showing the detailed structure of one example of programmable switches each of which can be advantageously provided at each of the intersections between the input and output lines of each of the AND-OR and input/output buffer blocks and the interconnection lines.

FIG. 5 illustrates a programmable connection structure between each of the input and output line 8 and 10, respectively, of each of the AND-OR logic blocks 2-1 through 2-3 and of the input and output lines 12 and 14 respectively, of each of the input/output buffer blocks 4-1 through 4-12 and the interconnection lines 6. In FIG. 5, as an exemplifying structure, a programmable connection structure between the input line 8 of the AND-OR logic block 2 and the interconnection lines 6 is illustrated. As shown in FIG. 5, a transmission gate 62 as a programmable switch is provided at each intersection between the input line 8 and the interconnection lines 6 such that one terminal of the transmission gate 62 is connected to the input line 8 and the other terminal of the transmission gate 62 is connected to the corresponding one of the interconnection lines 6. The transmission gate 62 is structurally similar to the previously described transmission gate 60 so that it can take either one of the two possible on and off states. In the illustrated embodiment, however, the control terminal of each of the transmission gates 62 is not directly connected to its associated EPROM but instead connected to a decoder 64 which in turn is connected to a predetermined number of EPROMs. As is obvious, only when the transmission gate 62 is set in a predetermined one of the two states, e.g., on state, the corresponding interconnection lines 6 is electrically connected to the input line 8 through the transmission gate 62.

Of importance, since the input line 8 is to be connected to a selected one of the plurality of interconnection lines 6 across which the input line 8 extends, so that the required number of EPROMs can be reduced by providing the decoder 64 between the transmission gates 62 and the EPROMs. For example, in the illustrated embodiment, if the state of each of the eight transmission gates 62 is to be controlled by its individual associated EPROM, there must be provided eight EPROMs. However, by using the decoder 64, the number of EPROMs may be reduced to four, including an enable signal bit 66 for determining whether or not to use this input line 8. In addition, in the case of the structure shown in FIG. 1, if no decoder is used, the total number of required EPROMs will be 924, including those for the programmable switches 16-1 through 16-5; on the other hand, if use is made of decoders for the connection control structure between the input and output lines of each of the AND-OR blocks 2-1 through 2-3 and the input/output buffer blocks 4-1 through 4-12 and the interconnection lines 6, the total number of required EPROMs will be 348, which is nearly ⅓ of that without decoders. Therefore, provision of an appropriate number of decoders 64 can substantially reduce the number of required EPROMs.

Returning to FIG. 1, in the illustrated embodiment, as described previously, each of the interconnection lines 6 may be divided into five segments 6-1 through 6-5 by means of five programmable switches 16-1 through 16-5. Each of the AND-OR logic blocks 2-1 through 2-3 has a plurality of input lines 8, some of which extend across one group of interconnection line segments, e.g., 6-1 for AND-OR logic blocks 2-1, and some of which extend across another group of interconnection line segments, e.g., 6-5 for AND/OR logic block 2-1. Similarly, the AND/OR logic block 2-1 has four output lines extending across different groups of interconnection line segments 6-1, 6-2, 6-4 and 6-5, respectively. Similarly, the other AND/OR logic blocks 2-2 and 2-3 also has a plurality of input and output lines 8 and 10 which extend across different groups of interconnection line segments.

Now, if a signal output from the input/output buffer block 4-1 is desired to be input into the input line 8 of each of the AND-OR logic blocks 202 and 2-3, it is only necessary to turn on the switches 16-5 between the group of segments 6-4 and the group of segments 6-5. On the other hand, if all of the input lines 8 of each of the AND-OR logic blocks 2-2 and 2-3 were provided to extend across only the groups of interconnection line segments 6-2 and 6-3, respectively, then the three groups of switches 16-1 through 16-3 would have to be turned on so as to supply a signal from the input/output buffer block 4-1 to the input line 8 of each of the AND-OR logic blocks 2-2 and 2-3.

In this manner, in accordance with the present embodiment described above, in the case when a signal from one of the input/output buffer blocks 4-1 through 4-12 is to be supplied to a plurality of AND-OR logic blocks 2-1 through 2-3 or in the case when a connection is to be established between two AND-OR logic blocks which are separated away from each other, the number of switches 16-1 through 15-5, through which the signal has to pass, in the interconnection lines 6 is minimized, and, in addition, the interconnection lines 6 may be made shorter in length. As a result, the number of interconnection lines 6 and the number of switches 16-1 through 16-5 may be minimized, thereby permitting to provide an increased operational speed.

In the above-described embodiment, use has been made of EPROMs for programmable memory elements to be provided in the AND-OR logic blocks 2-1 through 2-3 and as the programmable switch elements to be provided at a connection between the input and output lines of each of the AND-OR logic and input-/output buffer blocks and the interconnection lines and also at predetermined locations of the interconnection lines. However, use may also be made of EEPROMs instead of EPROMs at least partly, or use may also be made of other programmable elements, such as fuses and bipolar transistors, at least partly.

FIG. 6 schematically shows a programmable logic device constructed in accordance with another embodiment of the present invention. As shown, the illustrated programmable logic device includes an array of four logic unit cells 70-1 through 70-4 which are arranged in the form of a matrix. A pair of vertical global bus lines 72i-1 and 72i-2 extend vertically between logic unit cells 70-1 and 70-2 and between logic unit cells 70-3 and 70-4, respectively. In addition, another pair of horizontal global bus lines 72o-1 and 72o-2 extend horizontally between logic unit cells 70-1 and 70-3 and between logic unit cells 70-2 and 70-4, respectively. All of these vertical and horizontal global bus lines 72 merge at an interconnection switch unit 78. Each of the logic unit cells 70 has an input bus 74 comprised of a plurality of input lines and an output bus 76 comprised of a plurality of output lines. Thus, each of the logic unit cells 70 may receive or transmit a signal to and from the global bus lines 72 through the individual input and output buses 74 and 76. It is to be noted that each of the logic unit cells 70-1 through 70-4 may preferably has a structure shown in FIG. 10 which is structurally very similar to that shown in FIG. 1 excepting additional provision of two sets of programmable switches 84 which are associated with the input and output lines 74 and 76, respectively. It is to be noted that, in the illustrated embodiment, each set of the input and output lines 74 and 76 is comprised of six metal lines and each of the global buses 72 is comprised of 12 metal lines which are the collection of six input metal lines 74 and six output metal lines 76.

As mentioned briefly before, the interconnection switch unit 78 is provided at the intersection between the vertical and horizontal global buses 72. The interconnection switch unit 78 includes a plurality of programmable switches which may be programmed selectively so that a signal may be transmitted from one of the logic unit cells 70 to another logic unit cell 70 via the output bus 76, global bus 72 including the interconnection switch unit 78, and then the input bus 74. For example, if a signal is desired to be transmitted from logic unit cell 70-1 to logic unit cell 70-4, a signal passes through the output bus 76 of the logic unit cell 70-1, horizontal global bus 72o-1, interconnection switch unit 78, vertical global bus 72i-2 and the input bus 74 of the logic unit cell 70-4.

Figure 7:
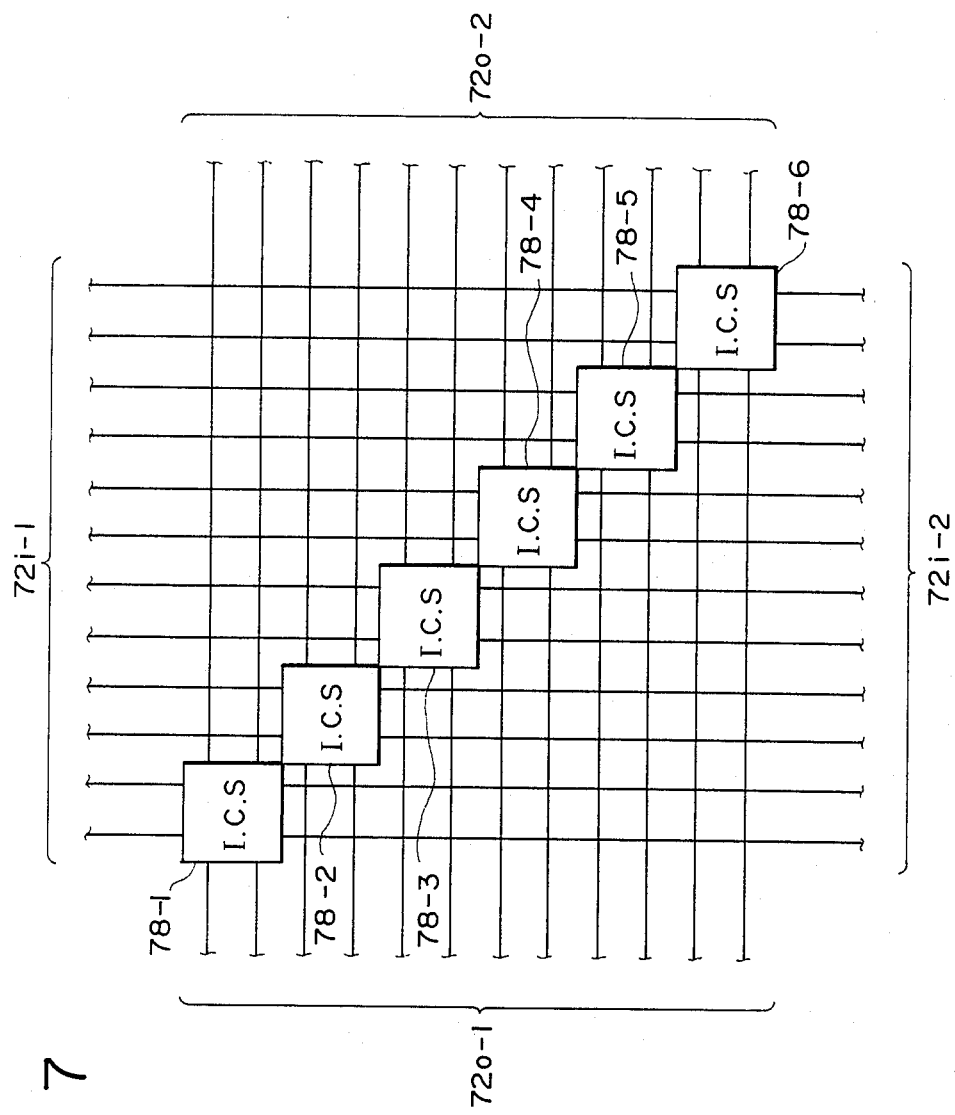
FIG. 7 is a block diagram showing a group of interconnection switches which may be advantageously provided in the structure shown in FIG. 6.
Figure 8:
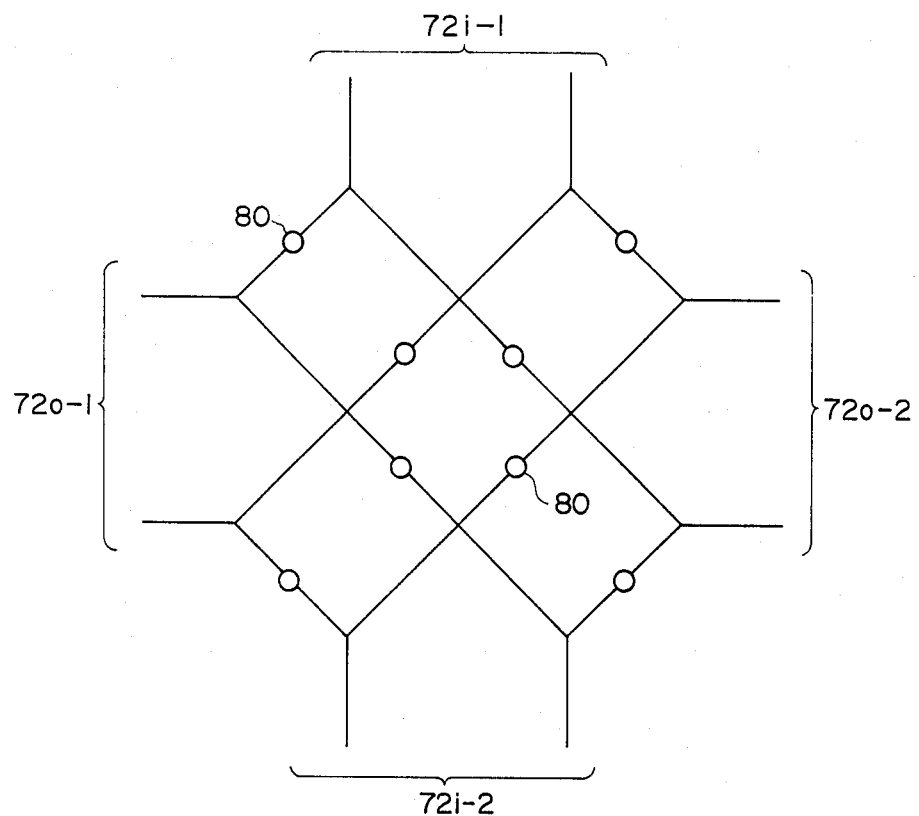
FIG. 8 is a schematic illustration showing the detailed structure of an interconnection switch which can be advantageously applied to the structure shown in FIG. 8.

FIG. 7 illustrates the structure of one example of the interconnection switch unit 78. The illustrated interconnection switch unit 78 includes six interconnection switch sub-units 78-1 through 78-6, each of which is preferably structured as shown in FIG. 8. That is, the interconnection switch sub-unit shown in FIG. 8 includes eight programmable switch elements 80 as connected as shown between two metal lines of the input global bus 72i-1 and two metal lines of the output global buses 72o-1 and 72o-2 and also between two metal lines of the other input global bus 72i-2 and two metal lines of the output global buses 72o-1 and 72o-2. Thus, the left-hand metal line of the upper input global bus 72i-1 may be connected to the upper metal line of the left-hand output global bus 72o-1 or to the lower metal line of the right-hand output global bus 72o-2 by turning on the corresponding programmable switch element 80. And, the right-hand metal line of the upper input global bus 72*i*-1 may be connected to the lower metal line of the left-hand output global bus 72*o*-1 or to the upper metal line of the right-hand output global bus 72*o*-2.

Figure 9:
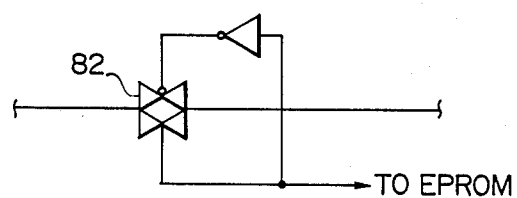
FIG. 9 is a schematic illustration showing the detailed structure of one example of a switch element which can be used to construct the interconnection switch shown in FIG. 8.

The programmable switch element 80 preferably has a structure shown in FIG. 9. That is, in the embodiment shown in FIG. 9, the programmable switch element 80 includes a transmission gate 82, an associated EPROM and an inverter. The transmission gate 82 has a conventional structure and it can take either one of the two possible states, i.e., on and off, and the state of the transmission gate 82 is controlled by the state of the associated EPROM, i.e., whether the associated EPROM is programmed or deprogrammed.

FIG. 10 illustrates the detailed structure of one example of each of the logic unit cells 70-1 through 70-4 shown in FIG. 6. As explained previously, it is to be noted that the structure shown in FIG. 10 is identical to the structure shown in FIG.1 excepting the additional provision of programmable switches 84 in the interconnection lines 6. These additional programmable switches 84 are provided in two sets in the metal interconnection lines 6 with the first set of switches 84 for the connection to the input lines 74 of the logic unit cell 70 and the second set of switches 84 for connection to the output lines 76 of the logic unit cell 70. Thus, all of the descriptions set forth above regarding the structure of FIG. 1 and each of the components shown in FIG. 1 may be equally applicable to the structure shown in FIG. 10 and components thereof.

The programmable switch 84 provided in each of the interconnection line 6 in FIG. 10 may preferably have a structure shown in FIG. 11. That is, the progammable switch shown in FIG. 11 includes a transmission gate 86, an associated EPROM (not shown) and an inverter. The transmission gate 86 is interposed between the associated interconnection line 6 and the associated input (or output) line 74 (or 76). The transmission gate 86 may take either one of the two possible states, e.g., on and off, and, for example, when the transmission gate 86 takes its on state, the associated input line 74 is electrically connected to the associated interconnection line 6 through the transmission gate 86. On the other hand, if the transmission gate 86 is set in its off state, the associated interconnection line 6 is electrically disconnected from the associated input line 74.

In the above-described embodiment, four logic unit cells 70-1 through 70-4 are provided in a single chip as a programmable logic device. Of course, however, that any desired number of logic unit cells 70 may be provided in a single programmable logic device.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A programmable logic device of a single semiconductor chip comprising:
   a plurality of AND-OR blocks arranged in a predetermined format, each block including an AND gate array and an OR gate array, at least one of which is programmable to define a desired logic function;
   a plurality of input/output buffer blocks;
   a plurality of interconnection lines;
   at least a pair of input and output lines of at least one of said plurality of AND-OR blocks, said pair of input and output lines extending across said plurality of interconnection lines;
   at least a pair of input and output lines of at least one of said plurality of input/output buffer blocks, said pair of input and output lines extending across said plurality of interconnection lines; and
   a plurality of programmable switches provided at selected ones of intersections between said input and output lines and said interconnection lines.

2. The device of claim 1 wherein said interconnection lines extend in parallel and each of said interconnection lines extend in the form of a closed loop with said plurality of AND-OR blocks disposed inside of said loop-shaped interconnection lines and said plurality of input/output buffer blocks disposed outside of said loop-shaped interconnection lines.

3. The device of claim 1 further comprising a plurality of additional programmable switches which are provided in at least some of said interconnection lines, thereby allowing each of said at least some of said interconnection lines to be divided into a predetermined number of interconnection line segments.

4. The device of claim 1 wherein said AND gate array is programmable and said OR gate array is fixed and thus not programmable.

5. The device of claim 1 wherein said AND and OR gate arrays are both programmable.

6. The device of claim 1 wherein each of said programmable switches includes a switch element which can take either one of two possible first and second states, a programmable element connected to said switch element for keeping said switch element in either of said first and second states.

7. The device of claim 6 further comprising a decoder connected between said switch elements of one of said input and output lines and their associated programmable elements.

8. The device of claim 1 wherein each of said plurality of input/output buffer blocks includes an input/output pin; an input buffer having an output terminal connected to said input/output pin and an input terminal connected from said input line; and output buffer having an input terminal connected from said input/output pin and an output terminal connected to said output line.

9. The device of claim 8 wherein each of said plurality of input/output buffer blocks further includes a flip-flop circuit which may be switchingly interconnected between the output terminal of said output buffer and said output line.

10. The device of claim 8 wherein each of said plurality of input/output buffer blocks further includes an inverter which may be switchingly interconnected between said input line and the input terminal of said input buffer.

11. The device of claim 8 wherein said input buffer has a control terminal which may be switchingly connected to one of three different signal sources.

12. The device of claim 11 wherein said three different signal sources include a ground voltage source, a power supply voltage source and a tristate signal source.

13. A programmable logic device comprising:
    a plurality of programmable logic unit cells arranged in a predetermined array;

first programmable interconnecting means for programmably interconnecting said plurality of programmable logic unit cells by establishing a desired first interconnection pattern among said plurality of programmable logic unit cells; and each of said plurality of programmable logic unit cells including a plurality of programmable AND-OR logic blocks, each of which includes an AND gate array and an OR gate array; a plurality of input/outout buffer blocks; and second programmable interconnecting means for programmably interconnecting said plurality of programmable AND-OR logic blocks by establishing a desired second interconnection pattern among said plurality of programmable AND-OR logic blocks and said plurality of input/output buffer blocks.

14. The device of claim 13 wherein said AND gate array is programmable and said OR gate is fixed and thus not programmable.

15. The device of claim 13 wherein said AND and OR gate arrays are both programmable.

16. The device of claim 13 wherein said first programmable interconnecting means includes a plurality of first interconnection lines extending in a predetermined pattern and each of said first interconnection lines includes at least one programmable switch.

17. The device of claim 16 wherein said programmable switch includes a transmission gate, which can take either one of two predetermined open and closed states, and a memory element connected to said transmission gate for keeping said transmission gate in one of said two states.

18. The device of claim 17 wherein said memory element is an EPROM.

19. The device of claim 16 wherein said first programmable interconnecting means further includes a pair of input and output lines extending from each of said plurality of programmable logic unit cells, said input and output lines extending across said plurality of first interconnection lines with said programmable switch provided at each of intersections between said input and output lines and said plurality of first interconnection lines.

20. The device of claim 13 wherein said second programmable interconnecting means includes a plurality of second interconnection lines and at least one programmable switch provided in each of said plurality of second interconnection lines, thereby permitting each of said plurality of second interconnection lines to be divided into a predetermined number of second interconnection line segments which are electrically isolated from one another.

21. The device of claim 20 wherein said second programmable interconnecting means further includes at least a pair of input and output lines extending from each of said plurality of programmable AND-OR logic blocks and of said plurality of input/output buffer blocks, said input and output lines extending across said plurality of second interconnection lines with said programmable switch provided at each of intersections between said input and output lines and said plurality of second interconnection lines.

22. The device of claim 13 wherein each of said plurality of input/output buffer blocks includes an input/output pin; an input buffer having an output terminal connected to said input/output pin and an input terminal connected from said input line; and an output buffer having an input terminal connected from said input/output pin and an output terminal connected to said output line.

23. The device of claim 22 wherein each of said plurality of input/output buffer blocks further includes a flip-flop circuit which may be switchingly interconnected between the output terminal of said output buffer and said output line.

24. The device of claim 22 wherein each of said plurality of input/output buffer blocks further includes an inverter which may be switchingly interconnected between said input line and the input terminal of said input buffer.

25. The device of claim 22 wherein said input buffer has a control terminal which may be switchingly connected to one of three different signal sources.

26. The device of claim 25 wherein said three different signal sources include a ground voltage source, a power supply voltage source and a tristate signal source.

* * * * *